Figure 1:
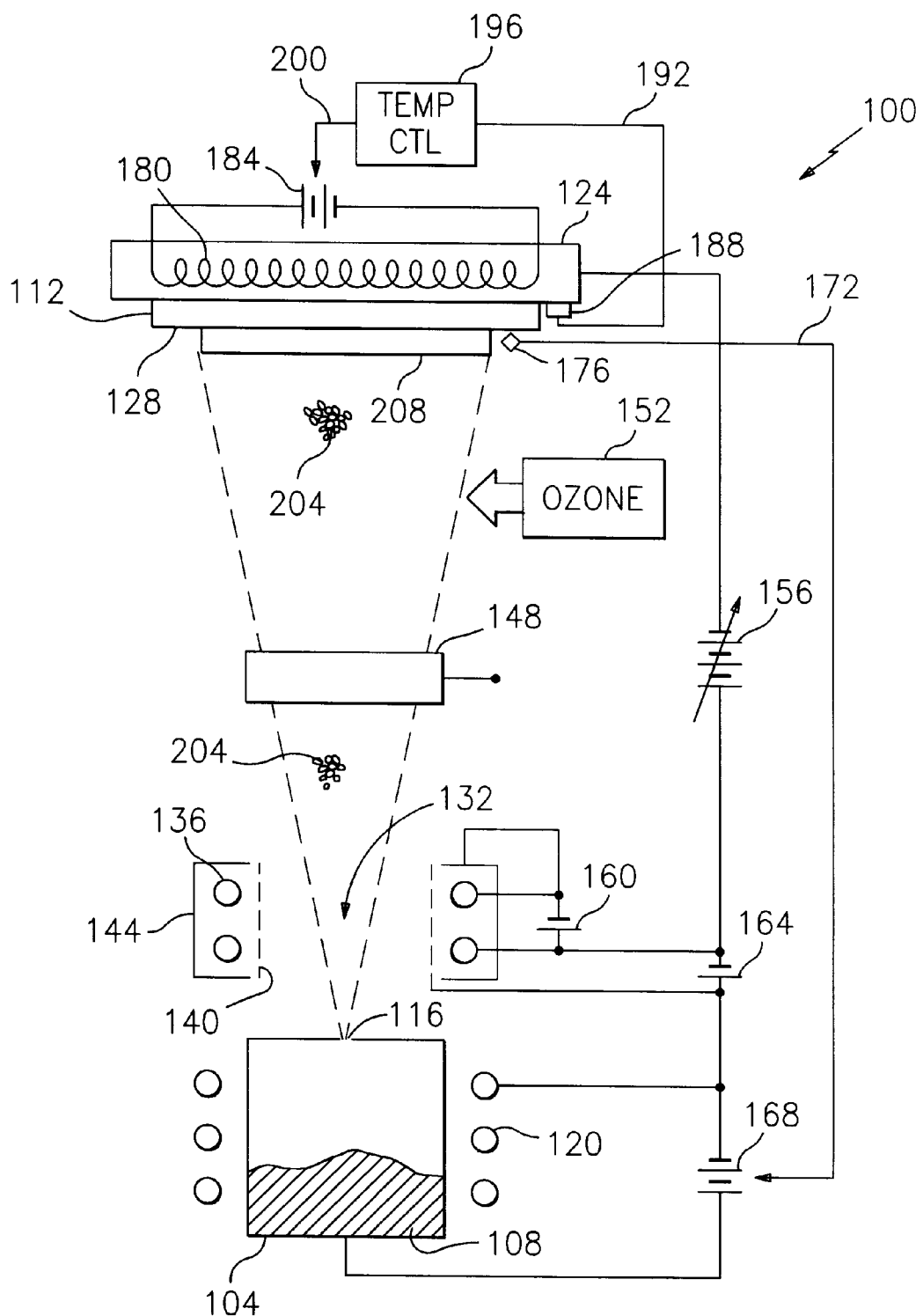

United States Patent
Tyson

[11] Patent Number: 6,008,125
[45] Date of Patent: Dec. 28, 1999

[54] METHOD OF ELIMINATING BURIED CONTACT RESISTANCE IN INTEGRATED CIRCUITS

[75] Inventor: Scott M. Tyson, Albuquerque, N.Mex.

[73] Assignee: UTMC Microelectronic Systems Inc., Colorado Springs, Colo.

[21] Appl. No.: 08/990,175

[22] Filed: Dec. 12, 1997

[51] Int. Cl.⁶ ................................................ H01L 21/44
[52] U.S. Cl. .......................... 438/666; 438/676; 438/657
[58] Field of Search ................................... 438/666, 674, 438/679, 676, 657

[56] References Cited

U.S. PATENT DOCUMENTS

| | | |
|---|---|---|
| 4,139,857 | 2/1979 | Takagi et al. . |
| 4,218,495 | 8/1980 | Takagi et al. . |
| 4,687,939 | 8/1987 | Miyauchi et al. . |
| 4,918,027 | 4/1990 | Fuse et al. . |
| 5,134,090 | 7/1992 | Bean et al. . |
| 5,350,607 | 9/1994 | Tyson et al. . |
| 5,350,698 | 9/1994 | Huang et al. . |
| 5,354,583 | 10/1994 | Zuhr et al. . |
| 5,380,683 | 1/1995 | Tyson et al. . |
| 5,470,794 | 11/1995 | Anujm et al. . |
| 5,561,326 | 10/1996 | Ito et al. . |

*Primary Examiner*—Jey Tsai
*Attorney, Agent, or Firm*—Morgan & Finnegan LLP

[57] ABSTRACT

A method is disclosed for forming a buried contact within an integrated circuit ("IC"). Initially, a gate oxide layer is deposited onto a surface of a silicon substrate. A first polysilicon layer is deposited onto the gate oxide layer using an ionized cluster beam ("ICB") technique. The first polysilicon layer and the gate oxide layer are patterned and etched at predetermined locations, exposing the underlying silicon substrate surface at these locations. A small amount of undesirable native oxide grows on the exposed substrate surface. This oxide represents an unwanted impedance, which degrades IC device performance. The ICB machine is then used to deposit a second layer of polysilicon on the silicon substrate, including over the oxide layer regions and over the exposed silicon substrate surface at the predetermined locations. This second polysilicon deposition step breaks up and removes the unwanted native oxide from the silicon substrate.

19 Claims, 2 Drawing Sheets

METHOD OF ELIMINATING BURIED CONTACT RESISTANCE IN INTEGRATED CIRCUITS

TECHNICAL FIELD

This invention relates generally to the ionized cluster beam ("ICB") deposition of materials, and more particularly to the ICB deposition of polycrystalline silicon ("polysilicon") onto a silicon substrate during the formation of a buried contact in an integrated circuit ("IC").

BACKGROUND ART

In the art of deposition of films of material onto a surface of a substrate, there are many known techniques, including vacuum deposition, ion plating, ion- and plasma-assisted, and the more modern ICB approach. ICB deposition is an ion-assisted technique in which the material to be deposited on a substrate is heated in a crucible and its vapor ejected through a small nozzle into a vacuum region. The vapor forms loosely-held atomic clusters, each cluster comprising 100 to 2000 atoms of the material. Some of the ejected vaporized atomic material is ionized by electron bombardment and the atoms are accelerated toward the substrate disposed in the vacuum region. The ionized material, together with the neutral (i.e., non-ionized) component of the vapor, arrive at the substrate surface for deposition thereon. ICB deposition offers the ability to precisely control the deposited film structure by applying kinetic energy to the vapor clusters during film deposition. Kinetic energy control is achieved by varying the acceleration voltage and the electron current for ionization.

In most of the known ion- and plasma-assisted deposition techniques, the individual atoms of the material to be deposited on the substrate generally impact the substrate surface with excessive kinetic energy, producing a relatively high number of defects in the substrate and/or the deposited film. With ICB deposition, a more useful lateral energy is obtained as the clusters impact the substrate and the atoms break off, without damaging the film and substrate. Due to the effects of ionized cluster bombardment, ICB deposition produces films with high density, strong adhesion, a low impurity level, and a smooth surface. Also, film properties usually associated with relatively high substrate temperatures in conventional vacuum depositions can be obtained at lower substrate temperatures in the ICB technique. This results in a distinct advantage in semiconductor device fabrication. See U.S. Pat. Nos. 4152478, 4217855, 5350607 and 5380683, all of which are hereby incorporated by reference.

The trend in the semiconductor manufacturing industry has always been to increase the number of active devices (e.g., transistors, resistors, capacitors) formed in an area of a semiconductor substrate (e.g., silicon, germanium). This increase in IC density has been achieved primarily by decreasing the size of the active devices and associated electrically-isolating areas formed on or in the IC substrate. Such size reduction has been achieved by improved fabrication methodologies. For example, it is common to employ buried contacts within the IC substrate. Buried contacts represent a method of using polysilicon, which normally comprises the gate terminal of a metal oxide semiconductor ("MOS") transistor, as a local wiring or interconnect scheme between various active devices formed as part of the IC. Basically, an ohmic contact is made to active device areas (e.g., the source and drain terminals of an MOS transistor) formed in the silicon substrate. Conductive interconnecting material is then routed between the ohmic contacts, connecting them together. This entire process is generally referred to as "metallization".

In this process, an electrically-insulating oxide layer is deposited or formed on a surface of a silicon substrate. The oxide layer is patterned and etched to expose the surface of the underlying substrate at desired locations. A layer of polysilicon (which ultimately serves as the metallization) is deposited over the surface of both the oxide and silicon substrate at the exposed openings in the oxide. Polysilicon deposition is typically carried out by a chemical vapor deposition ("CVD") process, in which gases are introduced into the reaction vessel. The gases react with one another, resulting in free silicon deposited on the substrate surface. The openings in the oxide layer define the locations for the buried contacts. The polysilicon film is doped by, e.g., implantation or diffusion, to establish a desired work function. Alternatively, the polysilicon film may be in-situ doped at the time of deposition. The polysilicon film is patterned to create the gate and local interconnect metallization structure.

The problem with this approach to forming the buried contacts is that after the oxide has been removed from the surface of the silicon substrate at the desired locations (in preparation for polysilicon deposition), a small amount of undesirable native oxide re-forms on the surface of the silicon substrate prior to polysilicon deposition. This interfacial oxide represents a source of unwanted resistance (more specifically, impedance) between the active device and the buried contact. Prior art polysilicon deposition techniques do not remove this oxide and resulting impedance, which ultimately degrades IC device performance. It is known in the prior art to utilize annealing to remove the oxide, but this adds unwanted process complexity. See, for example, U.S. Pat. No. 5470794.

DISCLOSURE OF INVENTION

Objects of the invention include the elimination of an undesirable layer of native oxide inherently formed on a silicon substrate during substrate processing in an oxygen environment when forming ICs, thereby eliminating an unwanted impedance that degrades IC device performance. Other objects include an increase in the design density of IC circuit devices formed on a semiconductor substrate.

According to the method of the invention, a semiconductor substrate comprises bulk monocrystalline silicon, either doped or undoped. A layer of electrically-insulating gate oxide material is deposited or formed by, e.g., thermal growth, onto a surface of the silicon substrate. The substrate is next placed within ICB apparatus, which is utilized to deposit a first layer of polysilicon over the gate oxide to a thickness of approximately 1000 Angstroms. In the ICB deposition technique, a crucible containing polysilicon is heated until a silicon vapor is formed. The vapor is ejected through a small nozzle into a vacuum region. The resulting adiabatic expansion of the vapor promotes formation of silicon atomic clusters. Some of the clusters are ionized, and electrons are stripped off the clusters. The clusters are accelerated toward the substrate, which is also within the vacuum region. The clusters impact the surface of the substrate, where they are deposited onto the gate oxide layer. The first polysilicon layer protects the gate oxide layer during subsequent processing steps.

The first polysilicon layer and the gate oxide layer are then patterned using a photoresist and removed by, e.g., chemical etching, at predetermined locations, thereby exposing the silicon substrate surface at these locations.

Once the polysilicon and oxide have been selectively removed, typically in an environment containing oxygen, a small amount of undesirable native oxide instantaneously grows on the surface of the silicon substrate at the exposed locations. This interfacial oxide represents an unwanted impedance that degrades IC performance.

Next, the ICB apparatus is utilized to deposit a second layer of polysilicon onto the first polysilicon layer and onto the exposed surfaces of the underlying silicon substrate. With a relatively low acceleration voltage ranging from 50 electron volts ("eV") to 5 thousand electron volts ("keV") during the initial portion of this second polysilicon deposition step, the silicon clusters striking the substrate surface will break up and remove the interfacial oxide. The subsequent portion of the second polysilicon deposition step may be carried out at a higher value of acceleration voltage. In this second deposition step, the remainder of the entire buried contact thickness of approximately 5000 Angstroms of polysilicon is deposited. Since ICB deposition of polysilicon onto the silicon substrate is carried out in a vacuum, no unwanted native oxide is formed during the ICB deposition process.

Alternatively, instead of using the second polysilicon deposition step to remove the native oxide, the ICB apparatus may be utilized to bombard the substrate surface with plasma ionized clusters. This optional surface preparation step has the similar effect of removing the native oxide prior to ICB deposition of the polysilicon that will ultimately form the buried contact.

The above and other objects and advantages of this invention will become more readily apparent when the following description is read in conjunction with the accompanying drawings.

BRIEF DESCRIPTION

FIG. 1 is a schematic illustration of ICB apparatus for depositing polysilicon onto a silicon substrate to form a buried contact in accordance with the method of the present invention; and FIGS. 2–7 are cross-sectional illustrations of a silicon substrate at various steps in the method of the present invention in forming the polysilicon buried contact using the ICB apparatus of FIG. 1.

BEST MODE FOR CARRYING OUT THE INVENTION

Referring to FIG. 1, the known ICB material deposition apparatus 100 illustrated therein is available from, e.g., Mitsubishi Corporation, Itami Works, Hyogo, Japan. The basic operating principles of the ICB apparatus 100 follow. Clusters of atomic material to be deposited on a substrate are formed by adiabatic expansion of material vapor passing through a nozzle. The clusters are then ionized by impact ionization using electrons of an appropriate energy. Cluster sizes distribute in a range of from 100 to 2000 atoms per cluster. The clusters bombard the substrate surface, and both ionized and neutral clusters are broken up and redistributed due to the high surface mobility of the loosely-held clusters. The scattered atoms may move over the substrate surface with such surface diffusion energy before they are physically attracted to the substrate surface. Such attraction is due to high kinetic energy parallel to the surface caused by conversion from the incident kinetic energy. The crystallographic structure and physical properties of thin films deposited using the ICB apparatus 100 are found to be strongly dependent upon the energy of the ionized material. This energy is controlled by the acceleration voltage during film deposition and, to a lesser extent, by substrate temperature.

The method of depositing a thin, high quality film of polysilicon onto a silicon substrate, in accordance with a preferred exemplary embodiment of the present invention, is described hereinafter with reference to the figures, with particular reference initially to FIG. 1. The ICB apparatus 100 includes a crucible 104 containing the polysilicon source material 108 to be deposited onto the silicon substrate 112. The crucible 104 may be comprised of, e.g., relatively inexpensive but purified graphite. The crucible 104 may contain polysilicon 108 in any physical form. The physical form of the polysilicon 108 in the crucible 104 is irrelevant, since the polysilicon is heated to a vapor state.

The crucible 104 has at least one small diameter ejection nozzle 116, along with heating elements 120, e.g., filaments, disposed adjacent the crucible walls. The filaments 120 heat the crucible by emitting electrons which impact the crucible. However, crucible heating may occur through other methods. One is radiation heating where heat is generated by a crucible heating filament. Another is resistance heating using electrons emitted from filaments located within the crucible walls. In this method, electrical current is flowed directly through the outer surface of the crucible. The method chosen for heating the crucible 104 is irrelevant to the present invention.

A substrate holder 124 comprises an electrically-conductive material. As described in detail hereinafter, a surface 128 of the substrate 112 has the polysilicon deposited thereon by the ICB apparatus 100 in accordance with the present invention. The polysilicon is ICB deposited in two steps; in a first step, the polysilicon is deposited onto a surface of a gate oxide layer formed on top of a surface of the silicon substrate; in a second step, the polysilicon is deposited onto the surface of the gate oxide layer and onto the surface of the underlying silicon substrate at predetermined openings formed in the gate oxide layer.

Disposed above and in proximity to the ejection nozzle 116 is an ionization chamber 132. The chamber 132 has one or more filaments 136 for emitting electrons. The chamber 132 also has acceleration electrodes 140 for accelerating the emitted electrons, and a shield 144 for preventing undesirable scattering of the electrons. Disposed above the chamber 132 is a shutter 148, which selectively prevents polysilicon vapor ejected from the crucible 104 from impinging onto the substrate surface 128.

All of the aforementioned components of the ICB machine 100 are disposed within a vacuum region or chamber having a pressure of preferably $1.33 \times 10^{-3}$ Pascals ("Pa") or less. An ozone source 152 may be provided for injecting a flow rate of ozone into the vacuum chamber.

A variable power supply 156 is connected between the substrate holder 124 and the ionization chamber 132. The supply 156 maintains the substrate holder at a relatively high negative potential with respect to the chamber. The electric field imparts kinetic energy to the positively ionized polysilicon clusters for their accelerated movement toward the substrate surface 128. A second power supply 160 is connected across the filaments 136 in the chamber 132. The supply 160 energizes the filaments 136, causing them to emit electrons.

A third power supply 164 is connected between the filaments 136 and acceleration electrodes 140. The supply 164 keeps the acceleration electrodes 140 at a highly positive potential with respect to the filaments 136. This potential accelerates the electrons emitted from the filaments 136 and ionizes some of the polysilicon clusters in the ionization chamber 132. This third power supply 164 provides an ionization current.

A fourth power supply 168 energizes the crucible filaments 120. The filaments 120 emit electrons which impact and, thus, heat the crucible 104. The supply 168 may be controlled by a signal on a line 172 provided by a quartz crystal 176. The crystal 176, which vibrates at a measurable frequency, is disposed in close proximity to the substrate 112. As more of the polysilicon 108 is deposited onto the substrate surface 128, the vibration frequency of the crystal 176 decreases. Since the change in the vibration frequency is related to the deposition rate, the crystal provides a simple method of monitoring the deposition rate of the polysilicon 108 onto the substrate surface 128. The supply 168 is responsive to the signal on the line 172 to vary the temperature of the crucible 104. For example, as the polysilicon deposition rate decreases, the crucible may be heated to increase the deposition rate.

The substrate holder 124 contains a coil 180 for heating the substrate 112 to a temperature which facilitates epitaxial growth of the polysilicon 108 onto the monocrystalline silicon substrate 112. A power supply 184 powers the coil in the substrate holder 124. A thermocouple 188 attached to the substrate provides a signal on a line 192 indicative of the temperature of the substrate 112. The signal is fed to a circuit 196 which compares the actual substrate temperature on the line 192 with a desired substrate temperature provided by an operator of the ICB apparatus 100. Any difference therebetween is provided on a signal line 200 to control the power supply 184.

In light of the foregoing description of the ICB machine 100, a description follows of the method of the present invention for depositing polysilicon 108 onto a silicon substrate 112 to form an IC buried contact. The polysilicon 108 starting material is loaded into the crucible 104 while the substrate 112 is loaded into the substrate holder 124. The crucible heating filaments 120 and the substrate heater 180 are energized by the corresponding power supplies 168, 184. As the crucible 104 heats up, the polysilicon 108 inside becomes a vapor.

The filaments 120 heat the crucible 104 to a desired temperature. The crucible temperature is regulated so that the pressures of the vapor in the crucible may exceed at least 100 times the pressure outside the crucible in the vacuum region. The greater the difference between the internal and external pressures of the crucible, the greater the ejection velocity of the vaporized material exiting the crucible.

The shutter 148 is opened to allow the polysilicon material ejected from the nozzle 116 of the crucible 104 to travel toward the substrate 112. The substrate heater 180 heats the substrate to a temperature of from 400 degrees C. to 600 degrees C., preferably approximately 600 degrees C. The acceleration power supply 156 is initially set between 50 eV and 5 keV. The ionization current power supply 164 is adjusted to provide an ionization current of 200 to 300 milliamps ("mA"), with a preferred value of 250 mA. The ozone source 152 is adjusted to provide an oxygen partial pressure within the high vacuum region in the range of $6.66 \times 10^{-3}$ Pa to $13.33 \times 10^{-3}$ Pa.

The polysilicon vapor in the crucible 104 is ejected into the vacuum region where it is supercooled due to adiabatic expansion. As a result, the polysilicon vapor forms atomic groups or clusters 204, each cluster 204 typically comprising approximately 100 to 2000 atoms loosely bonded together by van der Waals attractive forces.

Through kinetic energy imparted to the polysilicon when ejected through the nozzle 116, the polysilicon clusters 204 enter the ionization chamber 132. There, the clusters 204 are bombarded by electrons emitted from the filaments 136. The electron bombardment ionizes at least one atom within some of the clusters 204, thus forming partially ionized clusters 204. The ionization current is controlled by the ionization power supply 164. Other clusters 204 are not ionized and, thus, remain neutral.

The acceleration power supply 156 imparts kinetic energy to the ionized polysilicon clusters 204 to move and accelerate them toward the substrate 112. The energies imparted to the ionized clusters are controlled through variation of the acceleration power supply 156. The neutral clusters 204 also move toward the substrate 112 by the action of the kinetic energy received by the clusters when ejected from the crucible nozzle 116. When the clusters 204 reach the substrate surface 128, both types of clusters impinge on the surface, forming thereon a high quality film 208 of polysilicon.

When the ionized clusters 204 collide with the substrate 112, most of the kinetic energy of the clusters is converted into thermal energy. This energy is imparted to the surface layer 208 of polysilicon 108 being deposited on the substrate surface 128. At the same time, each ionized cluster 204 disintegrates into individual atomic particles, which move onto the deposited surface layer 208 to facilitate growth of a crystal due to the migration effects. Such effects can also be expected in the case of the neutral or non-ionized clusters 204. The migration effects are created at an elevated temperature caused by the thermal energy converted from the kinetic energy of the clusters and imparted to the deposited surface layer 208. These effects cause the growth of a crystal polysilicon film oriented by the crystal axis of the substrate 112.

Figure 2:
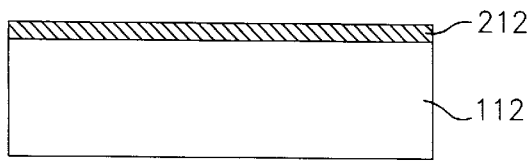

There illustrated to FIGS. 2–7, there illustrated are cross-sectional diagrams (not to scale) of the silicon substrate 112 at various steps in the method of depositing polysilicon 108 onto the substrate according to the present invention using the ICB apparatus 100, to ultimately form a buried contact. FIG. 2 illustrates the silicon substrate 112 having a layer of gate oxide 212 formed thereon. The gate oxide layer 212 may be thermally grown to a thickness of approximately 50 to 350 Angstroms.

Figure 3:
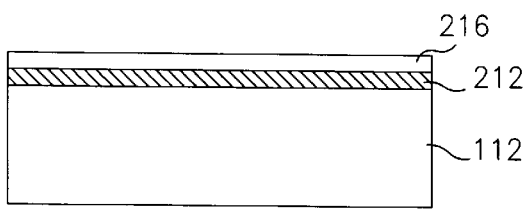

The silicon substrate 112, having the gate oxide layer 212 formed thereon, is preferably placed within the ICB apparatus 100 of FIG. 1, and the previously-described method of depositing polysilicon is carried out. As shown in FIG. 3, the resulting silicon substrate 112 has a first polysilicon layer 216 ICB deposited on top of the gate oxide layer 212 to a thickness of approximately 1000 Angstroms, utilizing an acceleration voltage of from 50 eV to 5 keV. However, it is to be understood that the first polysilicon layer 216 may be deposited or formed on top of the gate oxide layer 212 using other known methods besides the ICB technique. It is irrelevant to the broadest scope of the present invention how the first polysilicon layer 216 is formed on top of the gate oxide layer.

Figure 4:
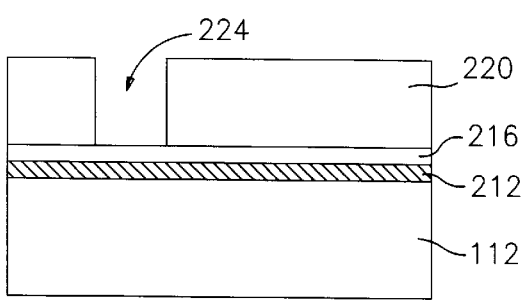

FIG. 4 illustrates a photoresist layer 220 located on top of the first polysilicon layer 216. The photoresist layer 220 is patterned to expose a portion of the upper surface of the polysilicon layer 216 where a buried contact will ultimately be formed. The patterning of the photoresist 220 defines an opening 224 in the photoresist. The first polysilicon layer 216 protects the gate oxide layer 212 from the photoresist, which is inherently destructive to the oxide.

Figure 5:
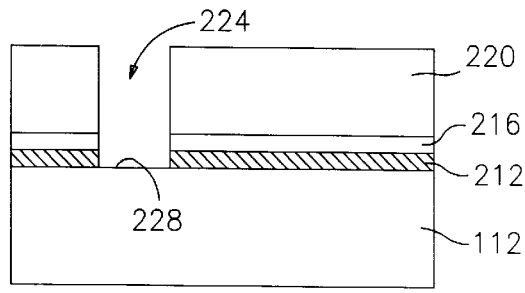
Figure 6:
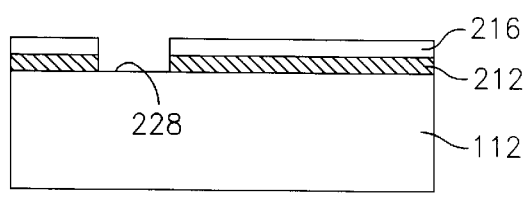

In FIG. 5, a wet or dry chemical etch of both the polysilicon layer 216 and the gate oxide layer 212 at the opening 224 in the photoresist layer 220 is performed. This etching step exposes a portion of the upper surface 228 of the silicon substrate 112 at the opening 224 in the photoresist 220. Any remaining photoresist 220 is then removed, as illustrated in FIG. 6. Also, at this time, the undesired layer of native or interfacial oxide instantaneously forms on the surface 228 of the silicon substrate 112. This is because the photoresist patterning and etching steps are typically carried out in an environment containing oxygen. The native oxide layer is typically 20 to 50 Angstroms thick.

Figure 7:
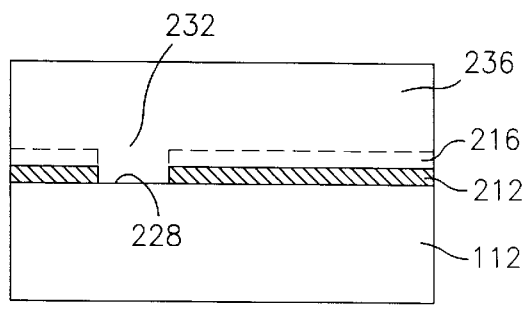

FIG. 7 illustrates the formation of the remainder of the buried contact region 232 by the ICB deposition of a second polysilicon layer 236 on top of the first polysilicon layer 216 and on top of the exposed surface 228 of the silicon substrate 112. The ICB deposition of this second polysilicon layer 236 is preferably carried out at an acceleration voltage of 50 eV to 5 keV. This value of acceleration voltage causes the initial polysilicon atomic clusters 204 striking the exposed silicon substrate surface 228 to sputter and clean that surface. The clusters 204 break up and effectively remove any undesired native oxide present on the exposed silicon substrate surface 228 prior to the formation of the second polysilicon layer 236 thereon. Dashed lines in FIG. 7 illustrate the approximate boundary between the first and second polysilicon layers 216, 236. However, since both layers are formed from similar polysilicon, one contiguous polysilicon layer results, comprising the buried contact 232.

After the ICB deposition of some portion of the second polysilicon layer 236, the acceleration voltage may then be increased to a higher value. Deposition of the remainder of the second polysilicon layer 236 proceeds to a thickness of approximately 5000 Angstroms, which is the thickness of the resulting buried contact 232. Once the buried contact 232 has been formed, the shutter 148 on the ICB apparatus 100 is closed, all power supplies are turned off, and the resulting substrate 112 is allowed to cool before being removed from the ICB apparatus 100. Subsequent known IC processing steps (such as formation of metallization layers) may then continue.

Although not illustrated in the figures, an optional step may be performed, utilizing the ICB apparatus 100 of FIG. 1, wherein instead of depositing the second polysilicon layer 236 to break up the native oxide, a surface preparation step may be performed wherein plasma is bombarded at the exposed surface 228 of the silicon substrate 112. This step of depositing plasma utilizing the ICB apparatus 100 has a similar effect of removing the native oxide.

It should be understood by those skilled in the art that obvious structural modifications can be made, in light of the teachings herein, without departing from the scope of the invention. Accordingly, reference should be made primarily to the accompanying claims, rather than the foregoing specification, to determine the scope of the invention.

Having thus described the invention, what is claimed is:

1. A method of forming a buried contact region as part of an integrated circuit, wherein the buried contact region comprises a conductive material comprising polycrystalline silicon in contact with a surface of a semiconductor substrate, the method comprising the steps of:

forming an insulating layer on at least a portion of the surface of the semiconductor substrate;

forming a first layer of the polycrystalline silicon conductive material on at least a portion of a surface of the insulating layer;

removing a portion of both the insulating layer and the first layer of the conductive material to expose a portion of the surface of the semiconductor substrate; and ionized cluster beam depositing a second layer of the polycrystalline silicon conductive material on the exposed portion of the surface of the semiconductor substrate, the second layer of polycrystalline silicon conductive material and a remaining portion of the first layer of polycrystalline silicon conductive material comprising the buried contact region, wherein the step of ionized cluster beam depositing the second layer of polycrystalline silicon conductive material further comprises the step of removing any undesirable oxide material from the exposed portion of the surface of the semiconductor substrate.

2. The method of claim 1, wherein the step of removing a portion of both the insulating layer and the first layer of polycrystalline silicon conductive material comprises the steps of:

forming a photoresist layer on a surface of the first layer of polycrystalline silicon conductive material;

patterning the photoresist layer to form an opening therein;

etching away the first layer of polycrystalline silicon conductive material at the opening formed in the photoresist layer; and etching away the insulating layer at the opening formed in the photoresist layer to expose the portion of the surface of the semiconductor substrate, wherein after the step of etching away the insulating layer undesirable oxide material forms on the exposed portion of the surface of the semiconductor substrate.

3. The method of claim 1, wherein the step of ionized cluster beam depositing the second layer of the polycrystalline silicon conductive material on the exposed portion of the surface of the semiconductor substrate comprises the steps of:

providing source material for the polycrystalline silicon conductive material in a crucible having a nozzle;

heating the crucible to a desired temperature to cause the source material therein to be vaporized at a predetermined vapor pressure within the crucible, the crucible vapor pressure being greater in magnitude than a predetermined pressure value of a vacuum region external to the crucible, thereby causing the vapor to be ejected through the nozzle and into the vacuum region and forming clusters of atoms of the source material by adiabatic expansion, the source material clusters being formed in the vacuum region outside of the crucible in the vicinity of the nozzle;

bombarding the source material clusters with electrons, thereby resulting in at least one of the source material clusters being partially ionized along with any remaining source material clusters remaining non-ionized; and accelerating both the ionized and non-ionized source material clusters toward the exposed portion of the surface of the semiconductor substrate thereby forming the second layer of polycrystalline silicon conductive material on the exposed portion of the surface of the semiconductor substrate.

4. The method of claim 1, wherein the step of forming the first layer of the polycrystalline silicon conductive material on at least a portion of the insulating layer comprises the step of ionized cluster beam depositing the first layer of the polycrystalline silicon conductive material on a least a portion of the insulating layer.

5. The method of claim 4, wherein the step of ionized cluster beam depositing the first layer of the polycrystalline silicon conductive material on at least a portion of the insulating layer comprises the steps of:

provideing source material for the polycrystalline silicon conductive material in a crucible having a nozzle;

heating the crucible to a desired temperature to cause the source material therein to be vaporized at a predetermined vapor pressure within the crucible, the crucible vapor pressure being greater in magnitude than a predetermined pressure value of a vacuum region external to the crucible, thereby causing the vapor to be ejected through the nozzle and into the vacuum region and forming clusters of atoms of the source material by adiabatic expansion, the source material clusters being formed in the vacuum region outside of the crucible in the vicinity of the nozzle;

bombarding the source material clusters with electrons, thereby resulting in at least one of the source material clusters being partially ionized along with any remaining source material clusters remaining non-ionized; and accelerating both the ionized and non-ionized source material clusters toward the insulating layer to form the first layer of polycrystalline silicon conductive material.

6. The method of claim 1, wherein the semiconductor substrate comprises silicon.

7. The method of claim 3, wherein the predetermined pressure value of the vacuum region is no greater than $1.33 \times 10^{-3}$ Pascals.

8. The method of claim 3, wherein the crucible is comprised of graphite.

9. The method of claim 3, wherein the step of heating the crucible comprises emitting electrons towards the crucible to heat the crucible by electron impact.

10. The method of claim 3, wherein the step of heating the crucible comprises resistive heating.

11. The method of claim 3, wherein the step of accelerating the source material clusters towards the semiconductor substrate comprises the step of applying an acceleration voltage of a predetermined value between the crucible and the semiconductor substrate.

12. The method of claim 11, wherein said predetermined value of said acceleration voltage is in the range of 200 to 500 electron volts.

13. The method of claim 3, further comprising the step of heating the semiconductor substrate to a predetermined controlled temperature.

14. The method of claim 13, wherein the predetermined temperature is in the range of 400 to 600 degrees centigrade.

15. The method of claim 3, further comprising the step of providing an oxygen partial pressure within the vacuum region in the range of $6.66 \times 10^{-3}$ Pa to $13.33 \times 10^{-3}$ Pa.

16. The method of claim 3, wherein the step of bombarding the source material clusters with electrons comprises the step of applying an electron ionization current of a predetermined value to an electron emitting filament.

17. The method of claim 16, wherein the predetermined value of the electron ionization current is in the range of 200 to 300 milliamps.

18. The method of claim 3, wherein the desired temperature of the crucible is controlled in response to a vibration frequency of a crystal, the vibration frequency being indicative of a thickness of the deposited conductive material onto the semiconductor substrate.

19. The method of claim 1, wherein the step of ionized cluster beam depositing the second layer of the polycrystalline silicon conductive material on the exposed portion of the surface of the semiconductor substrate also deposits the polycrystalline silicon conductive material on the surface of the first layer of polycrystalline silicon conductive material.

* * * * *

UNITED STATES PATENT AND TRADEMARK OFFICE
CERTIFICATE OF CORRECTION

PATENT NO. : 6,008,125

DATED : December 28, 1999

INVENTOR(S) : SCOTT M. TYSON

It is certified that error appears in the above-identified patent and that said Letters Patent is hereby corrected as shown below:

Column 6, line 37, change "There illustrated to FIGS. 2-7, there illustrated" to -- FIGS. 2-7 --.

Signed and Sealed this

Seventh Day of November, 2000

*Attest:*

Q. TODD DICKINSON

*Attesting Officer*      *Director of Patents and Trademarks*